(12) United States Patent
Tillotson

(10) Patent No.: US 12,199,449 B2
(45) Date of Patent: Jan. 14, 2025

(54) LASER SYSTEM FOR POWERING MULTI-JUNCTION PHOTOVOLTAIC CELL

(71) Applicant: Blue Origin, LLC, Kent, WA (US)

(72) Inventor: Brian Jay Tillotson, Kent, WA (US)

(73) Assignee: Blue Origin, LLC, Kent, WA (US)

( * ) Notice: Subject to any disclaimer, the term of this patent is extended or adjusted under 35 U.S.C. 154(b) by 210 days.

(21) Appl. No.: 17/656,182

(22) Filed: Mar. 23, 2022

(65) Prior Publication Data

US 2023/0035481 A1 Feb. 2, 2023

Related U.S. Application Data

(60) Provisional application No. 63/227,923, filed on Jul. 30, 2021.

(51) Int. Cl.
| | |
|---|---|
| *H02J 50/30* | (2016.01) |
| *B64U 50/31* | (2023.01) |
| *H01L 31/047* | (2014.01) |
| *H01L 31/05* | (2014.01) |
| *H01L 31/055* | (2014.01) |
| *H01L 31/0725* | (2012.01) |

(52) U.S. Cl.
CPC ............. *H02J 50/30* (2016.02); *B64U 50/31* (2023.01); *H01L 31/047* (2014.12); *H01L 31/0504* (2013.01); *H01L 31/0512* (2013.01); *H01L 31/055* (2013.01); *H01L 31/0725* (2013.01)

(58) Field of Classification Search
CPC ..... B64U 50/31; H01L 31/042; H01L 31/043; H01L 31/047; H01L 31/0504; H01L 31/0512; H01L 31/055; H01L 31/0725; H02J 50/30

See application file for complete search history.

(56) References Cited

U.S. PATENT DOCUMENTS

| | | | | |
|---|---|---|---|---|
| 4,295,002 A | * | 10/1981 | Chappell | H01L 31/047 257/466 |
| 5,261,969 A | * | 11/1993 | Stanbery | H01L 31/0749 257/E31.007 |
| 6,108,114 A | * | 8/2000 | Gilliland | H04B 10/564 398/1 |
| 8,008,572 B2 | | 8/2011 | Ortabasi | |
| 8,073,645 B2 | | 12/2011 | Fafard | |

(Continued)

FOREIGN PATENT DOCUMENTS

| | | | | |
|---|---|---|---|---|
| CN | 201336663 Y | * | 10/2009 | ............. H04B 10/12 |
| CN | 112425068 A | | 2/2021 | |

(Continued)

*Primary Examiner* — Levi Gannon
(74) *Attorney, Agent, or Firm* — Knobbe, Martens, Olson & Bear, LLP

(57) ABSTRACT

Systems and methods are provided for wirelessly transferring power to a multi junction photovoltaic cell of a space apparatus via a light emission system. The light emission system uses multiple lasers emitting different wavelengths and/or photon energies to produce electron-hole pairs in each layer of the multi junction photovoltaic cell to prompt power generation by the multi junction photovoltaic cell. The light emission system may be located on Earth or on another space apparatus. The multi junction photovoltaic cell can convert sunlight and the light emitted by the light emission system into electrical energy.

25 Claims, 5 Drawing Sheets

(56) References Cited

U.S. PATENT DOCUMENTS

| | | |
|---|---|---|
| 9,356,173 B2 | 5/2016 | Okandan et al. |
| 9,837,859 B2 | 12/2017 | Hiebl et al. |
| 10,155,586 B2 | 12/2018 | Liu et al. |
| 2008/0230112 A1* | 9/2008 | Barnham ............ H01L 31/0475 136/246 |
| 2009/0272424 A1* | 11/2009 | Ortabasi ............. H01L 31/0543 136/246 |
| 2015/0295114 A1 | 10/2015 | Meitl et al. |
| 2017/0018675 A1* | 1/2017 | Meitl ...................... H01L 27/14 |
| 2017/0110615 A1* | 4/2017 | Derkacs ............ H01L 31/03046 |
| 2020/0303964 A1* | 9/2020 | Sato .................... H01L 31/0693 |

FOREIGN PATENT DOCUMENTS

| | | |
|---|---|---|
| WO | WO 1987/001512 A1 | 3/1987 |
| WO | WO 2015/109242 A1 | 7/2015 |

\* cited by examiner

LASER SYSTEM FOR POWERING MULTI-JUNCTION PHOTOVOLTAIC CELL

CROSS-REFERENCE TO RELATED APPLICATION

This application claims the benefit of U.S. Provisional Application No. 63/227,923, filed Jul. 30, 2021, which is hereby incorporated by reference in its entirety.

BACKGROUND

Field

The technology relates to the wireless transmission of electrical energy, and in particular to a laser system for wirelessly transferring power to a multi junction photovoltaic cell.

Description of the Related Art

Satellites and other devices in space often utilize the solar spectrum to generate electrical power. These techniques can provide a means of generating power in the presence of sunlight; however, they give rise to technical challenges relating to powering the satellite in the absence of sunlight or without regard to sunlight.

SUMMARY

Various embodiments of systems, methods, and devices within the scope of the appended claims each have several aspects, no single one of which is solely responsible for the desirable attributes described herein. Without limiting the scope of the appended claims, some prominent features are described herein.

Disclosed herein are systems and methods for wirelessly transferring power to a multi junction photovoltaic device of a space apparatus via a light emission system. The light emission system uses multiple lasers emitting different wavelengths and/or photon energies to produce electron-hole pairs in each layer of the multi junction photovoltaic device, thereby allowing the multi junction photovoltaic device to generate electricity from the emitted light of the light emission system.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through use of the accompanying drawings. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

FIG. 2 also illustrates a visual representation of interactions between photons and a photovoltaic cell, in accordance with the present disclosure.

FIG. 4 also illustrates a visual representation of interactions between photons of the laser beams and a photovoltaic cell, in accordance with the present disclosure.

DETAILED DESCRIPTION

Figure 1:
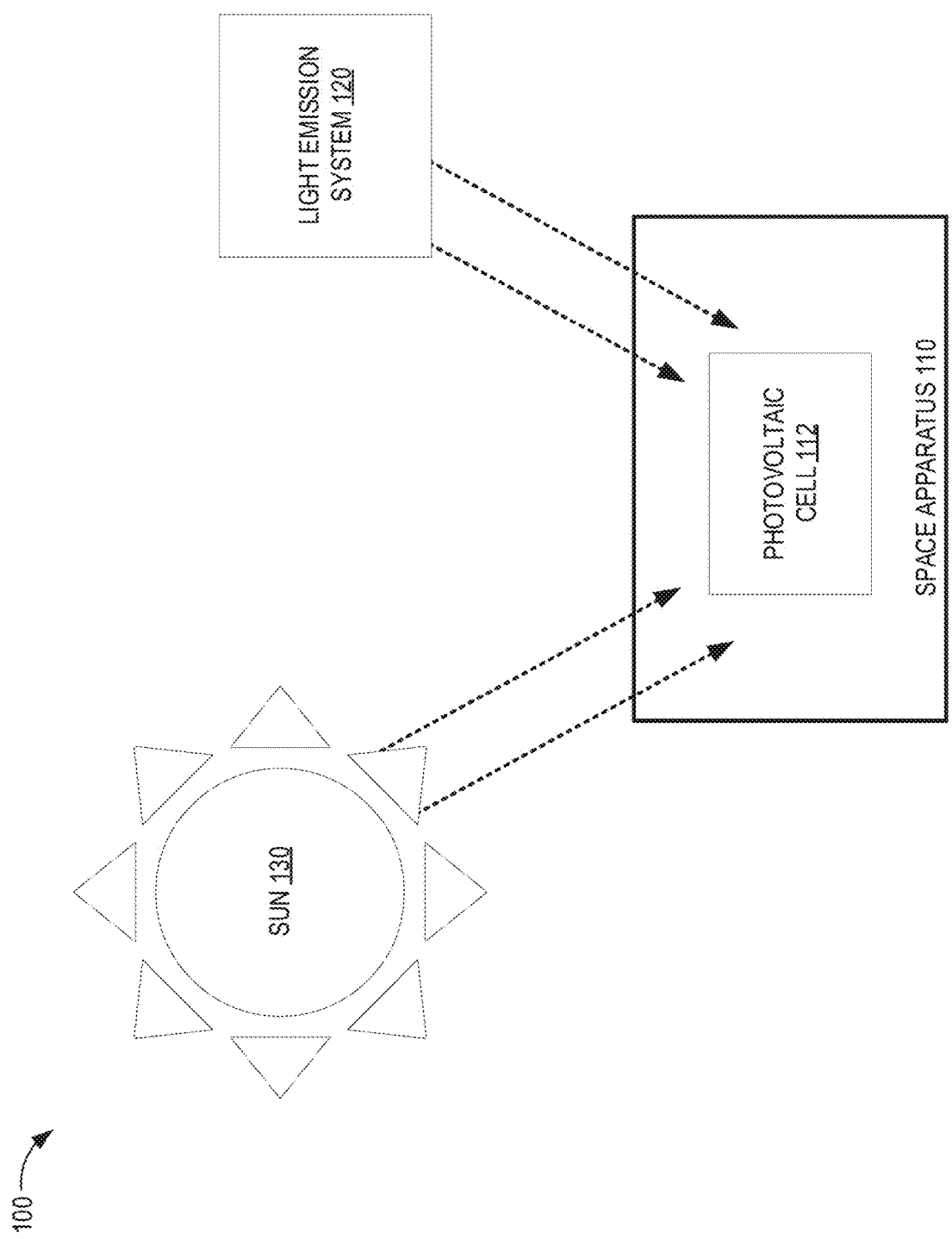
FIG. 1 illustrates an example of an environment for illuminating a photovoltaic cell of a space apparatus.

The following detailed description is directed to certain specific embodiments of the development. Reference in this specification to "one embodiment," "an embodiment," or "in some embodiments" means that a particular feature, structure, or characteristic described in connection with the embodiment is included in at least one embodiment of the present disclosure. The appearances of the phrases "one embodiment," "an embodiment," or "in some embodiments" in various places in the specification are not necessarily all referring to the same embodiment, nor are separate or alternative embodiments necessarily mutually exclusive of other embodiments. Moreover, various features are described which may be exhibited by some embodiments and not by others.

Various embodiments will now be described with reference to the accompanying figures, wherein like numerals refer to like elements throughout. The terminology used in the description presented herein is not intended to be interpreted in any limited or restrictive manner, simply because it is being utilized in conjunction with a detailed description of certain specific embodiments of the development. Furthermore, embodiments of the development may include several novel features, no single one of which is solely responsible for its desirable attributes or which is essential to practicing the present disclosure.

Space exploration and utilization present unusual challenges relating to electrical power. To that end, many satellites and other space apparatuses use photovoltaic devices (sometimes referred to as solar cells) to absorb sunlight and generate electrical power. Multi junction photovoltaic devices (sometimes referred to as multi-bandgap photovoltaic devices) use semiconductor materials with multiple bandgaps, or junctions, that absorb a specific region of the solar spectrum to generate power. In this way, multi junction photovoltaic devices tend to make efficient use of the solar spectrum.

Though sunlight provides an outlet for energy collection and power generation, sunlight is variable and may be at least temporarily unavailable during space operations. For example, a space apparatus may periodically enter eclipse (for example, when the Earth, moon, or other object at least partially prevents sunlight from reaching the space apparatus). As another example, a space apparatus may at least temporarily operate in shadowed regions, such as regions near the lunar poles, within craters, etc.

When sunlight is unavailable or reduced, it may be desirable to illuminate the satellite with laser light to produce power despite the darkness. However, conventionally, a multi junction photovoltaic cell cannot produce power from laser light, since laser light, being monochromatic, produces free charge carriers in only one layer of the cell, and a multi-junction photovoltaic cell generally needs free charge carriers in each of its layers to generate energy. One approach to producing power without sunlight includes exchanging the multi-junction photovoltaic cell for a single junction photovoltaic cell. Advantageously, a single-junction photovoltaic cell can produce power when illuminated by monochromatic light from a laser, and thus a single junction photovoltaic cell can generate power from sunlight and/or the light from the laser. However, since a single-junction photovoltaic cell uses a single bandgap, the single-junction photovoltaic cell tends not to make efficient use of the solar spectrum. As another approach, during times of limited or no sunlight, a space apparatus may revert to battery power, if it is available. However, batteries add mass, cost, and have a limited capacity and lifespan.

Accordingly, it can be advantageous for a space apparatus to obtain energy from a light source other than the sun, while also retaining capabilities to make efficient use of the solar spectrum. To that end, disclosed herein are systems and methods for wirelessly transferring power to a multi junction photovoltaic cell of a space apparatus via a light emission system. In particular, the light emission system uses multiple lasers emitting different wavelengths and/or photon energies to produce electron-hole pairs in each layer of a multi-junction photovoltaic cell to cause the multi junction photovoltaic cell to produce electric power. In some cases, the irradiance of each laser is tuned or selected such that every layer of the photovoltaic cell produces electron-hole pairs at approximately the same rate. In this way, approximately the same current flows in each layer, thereby making efficient use of the multi-junction photovoltaic cell.

By implementing a remote lighting emission system that illuminates the multi junction photovoltaic cell using multiple wavelengths and/or photon energies, a space apparatus can advantageously utilize the same multi junction photovoltaic cell for capturing sunlight and light emitted by the lighting emission system. In this way, the space apparatus advantageously retains the ability to wirelessly receive power, even in the absence of sunlight.

Environment Overview

FIG. 1 illustrates an example of an environment 100 for illuminating a photovoltaic cell 112 of a space apparatus 110. The environment 100 includes a space apparatus 110, a light emission system 120, and the sun 130. To simplify discussion and not to limit the present disclosure, FIG. 1 illustrates only one space apparatus 110 and light emission system 120, though multiple may be included in the environment 100. For example, in some cases, the light emission system 120 may be located on another space apparatus.

The space apparatus 110 can include any article, vehicle, device, machine, or object that is configured for travel or operation outside the Earth's atmosphere. For example, the space apparatus 110 can include, but is not limited to, a satellite, a spacecraft, space station, a telescope, a space probe, space equipment, a wearable device or clothing, planetary surface vehicle, space industrial processing equipment, or electronics associated therewith. In some cases, the space apparatus 110 can include any device configured to consume or store power. For example, the space apparatus 110 can include a power storage system, such as one or more batteries.

The space apparatus 110 can convert light into electrical energy, which the space apparatus 110 may use, store, or transfer to another device. For example, the space apparatus 110 can include a photovoltaic cell 112 that absorbs light and converts the light into electrical energy through the photovoltaic effect.

The photovoltaic cell 112 includes absorbing material, which includes one or more semiconductor materials. Each semiconductor material is typically composed of two different types of semiconductors—a p-type and an n-type—that are joined together to create a p-n junction. The joining of these two types of semiconductors forms an electric field in the region of the junction as electrons move to the positive p-side and holes move to the negative n-side. This electric field causes negatively charged particles to move in one direction and positively charged particles in the other direction. When light (which is composed of photons) of a suitable photon energy is exposed to the semiconductor material, energy from a photon is transferred to an electron of the semiconducting material, causing the electron to jump to a higher energy state known as the conduction band. In their excited state in the conduction band, these electrons are free to move through the material, and it is this motion of the electrons that creates an electric current in the semiconductor material.

The photon energy needed to excite an electron across this junction, or gap, is referred to as the bandgap energy. Photon energy that is equal to or higher than the bandgap energy of a particular semiconductor material can excite the electrons across the junction; however, photon energy that is lower than the bandgap energy will pass through the semiconductor material. The energy of each photon is illustrated by the relationship shown in Equation 1, below:

$$E = hv = \frac{hc}{\lambda} \quad \text{(Equation 1)}$$

where E is photon energy, h is Planck's constant ($6.626 \times 10^{-34}$ joules·s), v is frequency, $\lambda$ is photon wavelength, and c is the speed of light ($2.998 \times 10^8$ m/s). As indicated from Equation 1, there is an inverse relationship between the energy of a photon (E) and the wavelength of the photon ($\lambda$). This inverse relationship indicates that light consisting of relatively high energy photons has a shorter wavelength than light consisting of relatively low energy photons and, as a corollary, light consisting of relatively low energy photons has a longer wavelength than light consisting of relatively high energy photons.

In some cases, the photovoltaic cell 112 is a single junction cell that includes a single p-n junction made of semiconductor material. In some cases, the photovoltaic cell 112 is a multi junction photovoltaic cell that includes multiple p-n junctions made of different semiconductor materials, where each semiconductor material's p-n junction will produce electric current in response to different wavelengths of light and/or photon energies.

A multi junction photovoltaic cell includes a plurality of layers of different semiconductor materials. The ordering of the layers of semiconductor materials can be based on the associated band-gap energies of the semiconductor materials. For example, the layers are organized in descending order based on bandgap energies, with the semiconductor material associated with the largest bandgap energy on top (or closest to a first side) and the semiconductor material associated with the smallest bandgap energy on the bottom (or closest to a second side opposite the first side). This layering order creates a "photon sorting" effect such that photons with higher energy are absorbed by a top layer, while lower energy photons pass through the top layer to the other layer(s). Higher energy photons of the ones that are transmitted through the top layer are then absorbed by the next layer, while the even lower energy photons continue to pass through. As mentioned, there is an inverse relationship between the energy of a photon (E) and the wavelength of the photon (k). Accordingly, the layers can be considered organized in ascending order with respect to wavelength. For example, each layer of semiconductor material absorbs light of a particular wavelength. Thus, the layers of semiconductor material can be organized according to the wavelengths that they absorb. For example, the semiconductor material that absorbs the shortest wavelength of light may be the top layer, and the subsequent semiconductor material that absorbs the longest wavelength of light may be the bottom layer.

The semiconductor materials can include, but are not limited to, silicon, gallium, silicon carbide, arsenic, indium, graphene, carbon nanotube, bismuth, barium titanate, phosphorene, germanium, and gallium arsenide, indium phosphide, tin, tellurium, or lead halide or tin halide in a perovskite-structured crystal lattice.

The light emission system 120 includes one or more light emitting devices for illuminating the photovoltaic cell 112 using different wavelengths and/or photon energies. In some cases, rather than emitting the light itself, the light emission system 120 can reflect light, such as sunlight received from Earth or another space apparatus.

Although the environment 100 of FIG. 1 is generally described as wirelessly transferring energy to a photovoltaic cell 112 of a space apparatus 110, it will be appreciated that similar concepts may be used to wirelessly transfer energy to any photovoltaic cell, without regard to its location. As a non-limiting example, systems and methods described herein may be used for solar energy harvesting. For example, in one non-limiting embodiment, a space apparatus may include a first photovoltaic cell 112 and the light emission system 120, and a second photovoltaic cell 112 may be located on Earth. In some such cases, the first photovoltaic cell 112 can generate power from sunlight, and the light emission system 120 can use the power generated by the first photovoltaic cell 112 to illuminate the second photovoltaic cell 112. In this way, the light emission system 120 and first photovoltaic cell 112 may be used for solar energy harvesting.

Converting Sunlight into Electrical Energy Using a Multi-Junction Photovoltaic Cell As described herein, a space apparatus 110 can include one or more solar cells for converting sunlight into electrical energy, which can be stored (for example, in a battery) and/or used to power at least a portion of the space apparatus 110. In some cases, the solar cells are multi junction photovoltaic cells. Multi junction photovoltaic cells are solar cells made of multiple layers of different semiconductor materials. As described herein, each semiconductor material produces electric current (and is conductive) in response to different wavelengths of light and different bandgap energies, for example based on the properties of the particular semiconductor material. In general, the semiconductor layers of the multi-junction photovoltaic cells are electrically connected in series. In some such cases, the multi-junction photovoltaic cell does not conduct electricity unless each of the semiconductor layers is concurrently conductive.

Figure 2:
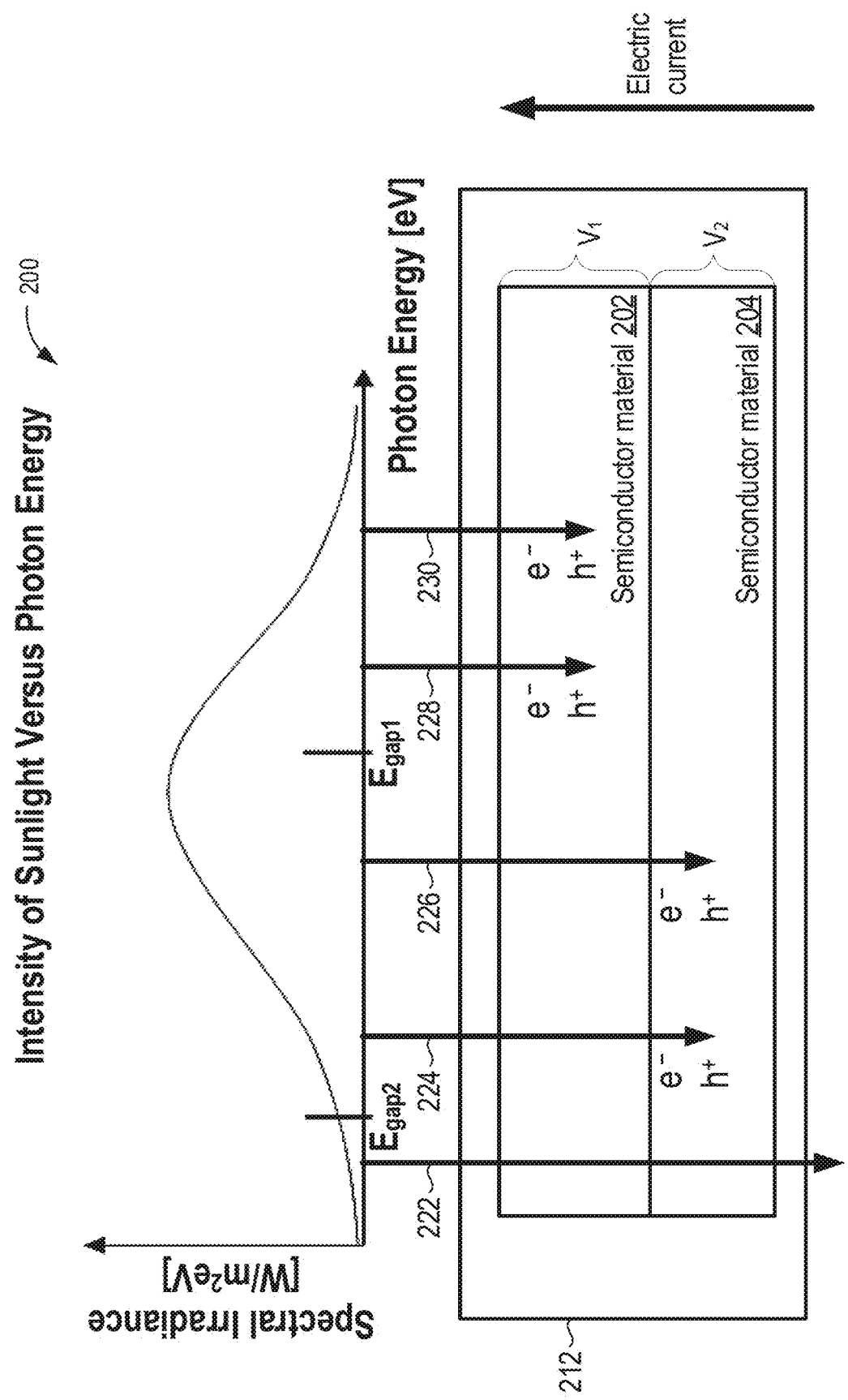
FIG. 2 includes a graph illustrating example intensity of sunlight plotted against photon energy.

FIG. 2 includes a graph 200 illustrating the intensity of sunlight plotted against photon energy. The vertical axis on the graph 200 corresponds to light intensity, also called energy flux or irradiance, in energy per area per time (W/m$^2$ eV). The horizontal axis on the graph 200 corresponds to photon energy, in electron volts (eV). As shown by the graph 200 of FIG. 2, sunlight has photons with different energy values (and thus different wavelengths). Furthermore, as indicated by the substantially bell-shaped curve, there is a higher intensity of photons at the peak of the curve than on each side of the peak.

FIG. 2 also illustrates a visual representation of interactions between example photons (represented by arrows 222, 224, 226, 228, and 230) and the photovoltaic cell 212. For ease of reference, the photons are referred to as photons 222, 224, 226, 228, and 230. In this example, the energy of a particular photon corresponds to the position of its representative arrow along the x-axis of graph 200. Thus, the photons 222, 224, 226, 228, and 230 increase in energy as they move from left to right along the x-axis of graph 200. Furthermore, given the inverse relationship between the energy of a photon and the wavelength of the photon, the photons 222, 224, 226, 228, and 230 decrease in wavelength, respectively.

In this example, the photovoltaic cell 212 is a two-junction photovoltaic cell that includes two layers of semiconductor materials 202, 204. As described herein, each layer of semiconductor materials 202, 204 is associated with a different bandgap energy. In particular, semiconductor material 202 is associated with a bandgap energy of $E_{gap1}$, indicating that semiconductor material 202 absorbs photons having a photon energy that is equal to or greater than $E_{gap1}$. Furthermore, semiconductor material 204 is associated with a bandgap energy of $E_{gap2}$, indicating that semiconductor material 204 absorbs photons having a photon energy that is equal to or greater than $E_{gap2}$.

In this example, the semiconductor materials 202, 204 are layered in descending order (for example, in decreasing proximity to the sun 130) based on their associated bandgap energies such that the semiconductor material 202 (associated with the bandgap energy of $E_{gap1}$) is layered on top of the semiconductor material 204 (associated with the bandgap energy of $E_{gap2}$). As described herein, layering the semiconductor materials 202, 204 in an order based on bandgap energy creates a photon sorting effect such that photons with relatively high energy (i.e., equal to or greater than $E_{gap1}$) are absorbed by the semiconductor material 202, while lower energy photons pass through the semiconductor material 202 to the semiconductor material 204.

In the illustrative example of FIG. 2, the photons 228, 230 have photon energy greater than $E_{gap1}$ and thus are absorbed by the semiconductor material 202. Absorbing a photon yields an electron (e−) and an electron hole (h+). These free charge carriers flow across the semiconductor material 202, providing electrical energy based on the following relationship:

$$E = e*V_1 \qquad \text{(Equation 2)}$$

where E is the electrical energy in coulomb-volt (C·V), e is electron charge in coulombs (C), and $V_1$ is the junction voltage of the semiconductor material 202.

Continuing with the example of FIG. 2, the photons 222, 224, 226 have photon energy less than $E_{gap1}$ and therefore pass through the semiconductor material 202 and enter the semiconductor material 204. Of the photons that enter the semiconductor material 204, the photons 224, 226 have photon energy greater than $E_{gap2}$ and thus are absorbed by the semiconductor material 204, providing electrical energy based on the following relationship:

$$E = e * V_2 \quad \text{(Equation 3)}$$

where E is the electrical energy in coulomb-volt (C·V), e is electron charge in coulombs (C), and $V_2$ is the junction voltage of the semiconductor material 204. In this example, the junction voltage $V_2$ of the semiconductor material 204 is smaller than the junction voltage $V_2$ of the semiconductor material 202.

The photon 222 has photon energy less than $E_{gap2}$ and therefore passes through the semiconductor material 204. Since, in this example, the photovoltaic cell 212 has no layers below the semiconductor material 204, the photon 222 exits the photovoltaic cell 212 and its energy is lost. However, it will be understood that the number of semiconductor materials, and their associated bandgap energies, in a particular photovoltaic cell may vary across embodiments.

Light Emission System

In general, a single laser emits monochromatic light (light of a single wavelength) and thus can only produce light with a single photon energy. As such, such a laser is limited to producing free charge carriers in only one layer of a multi junction photovoltaic cell. Since a multi junction photovoltaic cell generally needs free charge carriers in each of its layers to generate energy, the monochromatic light emitted by the laser is generally unable to activate each semiconductor layer of the multi junction photovoltaic cell. Thus, in general, a single laser cannot cause a multi junction photovoltaic cell to generate energy.

Implementations of the present disclosure advantageously solve these and other drawbacks by implementing a lighting emission system that utilizes multiple light emitting devices (such as multiple lasers) and thereby emits multiple wavelengths of light. Accordingly, implementations of light emission systems according to the present disclosure can advantageously enable lasers, which have narrow spectra, to deliver power to a multi-junction photovoltaic cell.

Figure 3:
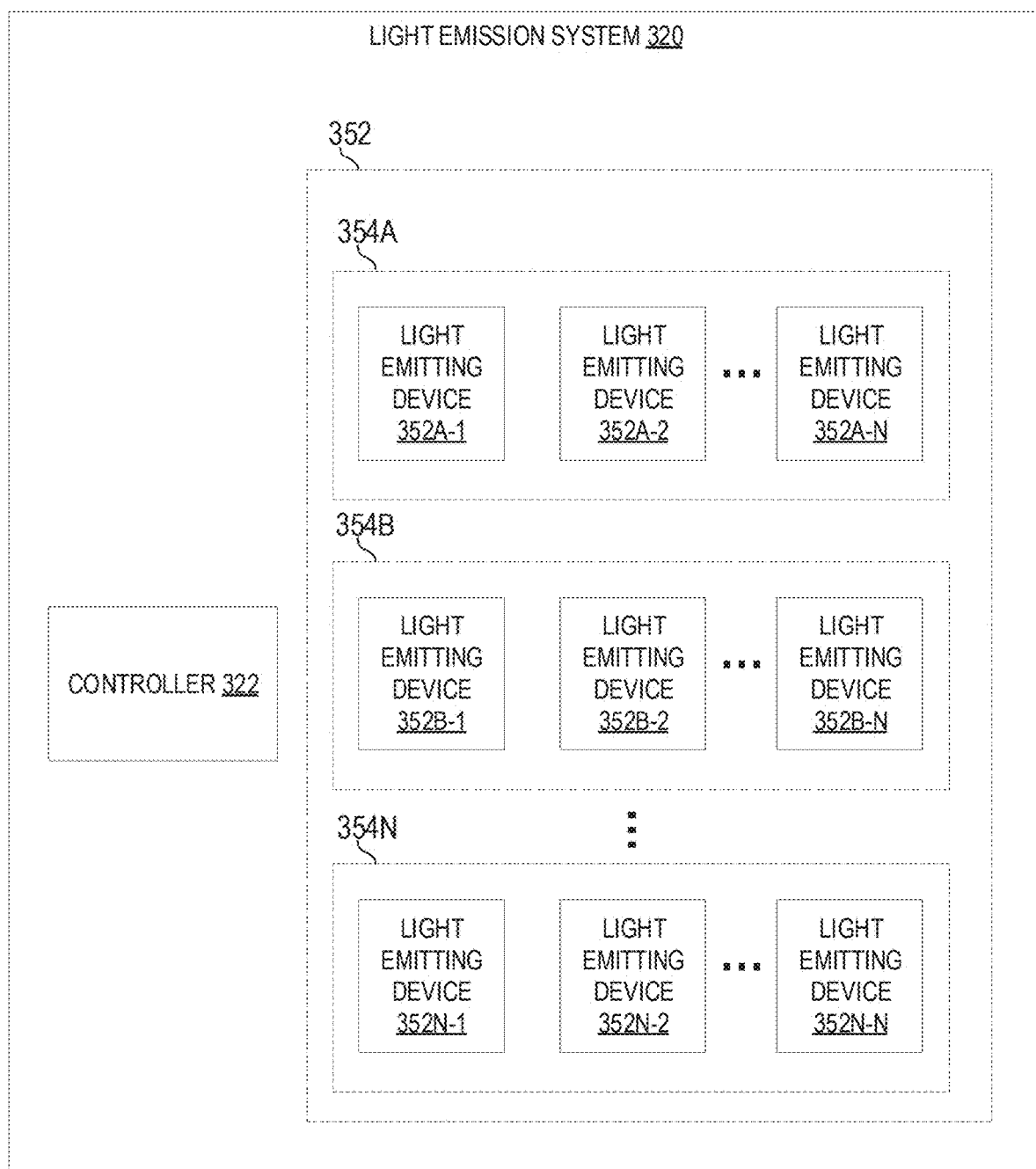
FIG. 3 illustrates an example light emission system in accordance with the present disclosure.

FIG. 3 illustrates an example light emission system 320 in accordance with the present disclosure. The light emission system 320 includes a controller 322 and one or more light emitting devices 352. The light emission system 320 can emit light to illuminate a remotely located photovoltaic cell (for example, the photovoltaic cell 112 or 212 of FIG. 1 or 2, respectively), of a space apparatus. It will be appreciated that the light emission system 320 represents an example light emission system and other examples may use fewer, additional, or different components or arrangements. For example, the light emission system 320 may be an example of the light emission system 120 of FIG. 1, or it may include one or more of the components of the environment 100 of FIG. 1, such as the photovoltaic cell 112.

The implementation of the one or more light emitting devices 352 can vary across embodiments. For example, a lighting emitting device 352 can include, but is not limited to, a laser, such as a solid-state laser, a gas laser, a liquid laser, or a semiconductor laser. In some cases, the light emitting device 352 can include, but is not limited to, a krypton-argon laser, a gallium arsenide laser, an indium laser, a helium-neon laser, an argon laser, a krypton laser, a xenon ion laser, a nitrogen laser, a carbon dioxide laser, a carbon monoxide laser, an excimer laser, a hydrogen fluoride laser, a deuterium fluoride laser, a coil (chemical oxygen-iodine laser), an agil (all gas-phase iodine laser), a strained quantum-well AlGaInP laser, or any other suitable laser, or a combination of one or more thereof. In some cases, the one or more light emitting devices 352 can include any device configured to emit particular wavelengths of light, such as any device configured to emit ultra-violet light, microwaves, visible light, or infrared light. Each light emitting device 352 can include a distinct aperture, or more than one lighting emitting device 352 can share an aperture. In some cases, the apertures are sized to produce the same or an approximately equal beam angle. By producing the same beam angle, the light emitting devices 352 give the same spot size at a multi junction photovoltaic cell 212 if the light emitting devices 352 are at substantially the same distance from the multi junction photovoltaic cell 212 (for example, all are on Earth and transmitting to geosynchronous earth orbit (GEO)).

The one or more light emitting devices 352 are placed into one or more groups 354A, 354B, ..., 354N (individually or collectively referred to as group 354 or groups 354) such that each group 354 includes at least one light emitting device 352. In some implementations, each group 354 includes the same number of light emitting devices 352. In other implementations, two or more groups 354 may include a different number of light emitting devices 352.

Although the groups 354 are illustrated as being mutually exclusive, in some cases, at least one light emitting device 352 can be part of more than one group 354. For example, the light emission system 320 can include a frequency doubler. In some such cases, one group (for example, group 354A) can include a first laser and another group (for example, group 354B) can include the first laser and the frequency doubler. As a non-limiting example, consider a scenario in which a light emitting device 354A of a first group 354 is a single actual type of laser (for example, an InGaAs quantum dot (QD) laser at λ=1156 nm), together with a frequency doubler (for example, an enhancement cavity holding a periodically poled LiNbO3 crystal (PPLN)). Frequency doubling can create a second beam of light having half the wavelength (in this example, 578 nm) and twice the photon energy (2.14 eV). Thus, in some cases, a frequency doubler can create the same effect as using two actual laser types: two substantially different wavelengths are created and used to produce electron-hole pairs in two layers of the multi junction photovoltaic cell 212. To simplify discussion and not to limit the present disclosure, FIG. 3 illustrates three groups 354, although any number of groups 354 may be suitably implemented.

Each group 354 can include at least one light emitting device. For instance, in the illustrated example of FIG. 3, the group 354A includes the light emitting devices 352A-1, 352A-2, ..., 352A-N (individually or collectively referred to as light emitting device 352A or light emitting devices 352A), the group 354B includes the light emitting devices 352B-1, 352B-2, ..., 352B-N (individually or collectively referred to as light emitting device 352B or light emitting devices 352B), and the group 354N includes the light emitting devices 352N-1, 352N-2, ..., 352N-N (individually or collectively referred to as light emitting device 352N or light emitting devices 352N). To simplify discussion and not to limit the present disclosure, each group 354 is illustrated as including three lighting emitting devices 352, although any group 354 may include any suitable number of lighting emitting devices 352.

In some cases, the light emitting devices 352 of a particular group 354 include one or more common or related characteristics, such as, but not limited to, a common wavelength or range of wavelengths, a common photon energy or range of photon energies, a common photon flux or range of photon fluxes, a common laser type, etc. Furthermore, in some cases, each group 354 is associated with one or more characteristics that are different from another group. For example, the group 354A may be associated with a first characteristic (for example, a first wavelength or first range of wavelengths, a first photon energy or a first range of photon energies, a first photon flux or a first range of photon fluxes, or a first laser type), the group 354B may be associated with a second characteristic (for example, a second wavelength or second range of wavelengths, a second photon energy or a second range of photon energies, a second photon flux or a second range of photon fluxes, or a second laser type) that is different from the first characteristic.

As a non-limiting example, consider a scenario in which each light emitting device 352A of group 354A emits light having a wavelength that satisfies a first wavelength threshold (for example, 668 nm, or between 600 nm and 700 nm), each light emitting device 352B of group 354B emits light having a wavelength that satisfies a second wavelength threshold (for example, 753 nm, or between 700 nm and 800 nm), and each light emitting device 352N of group 354N emits light having a wavelength that satisfies a third wavelength threshold (for example, 940 nm, or between 900 nm and 1000 nm). In an example implementation, each light emitting device 352A of group 354A includes a strained quantum-well AlGaInP laser emitting light having a first wavelength of about 668 nm and photon energy of about 1.86 eV; each light emitting device 352B of group 354B includes a krypton laser emitting light having a second wavelength of about 753 nm and photon energy of about 1.65 eV; and each light emitting device 352N of group 354N includes a GaAs laser emitting light having a third wavelength of about 940 nm and photon energy of about 1.32 eV. In some cases, the first, second, and third wavelength thresholds are based at least in part on the semiconductor materials of a multi junction photovoltaic cell 212. For example, as described herein, a multi-junction photovoltaic cell 212 includes multiple, stacked layers of semiconductor material, and each layer of semiconductor material absorbs light of a particular wavelength. For example, the multi junction photovoltaic cell 212 can include a stacked multilayer geometry such that the plurality of layers are arranged or stacked one on top of the other and substantially coextensive, wherein an upper layer is proximate the light emission system 320 relative to a lower layer. In this way, in some cases, a lower layer only receives illumination that has first passed through and/or been re-emitted by an upper layer (for example, due to photon recycling). In some cases, the multi junction photovoltaic cell 212 includes a plurality of interface surfaces positioned between each of the plurality of layers. Assuming the multi-junction photovoltaic cell 212 includes three layers of semiconductor materials, the first wavelength threshold can correspond to a wavelength that the first semiconductor material absorbs, the second wavelength threshold can correspond to a wavelength that the second semiconductor material absorbs and the first semiconductor material allows to pass therethrough, and the third wavelength threshold can correspond to a wavelength that the third semiconductor material absorbs and the first and second semiconductor materials allow to pass therethrough.

As another non-limiting example, consider a scenario in which each light emitting device 352A of group 354A emits light having a photon energy that satisfies a first energy threshold (for example, 1.82 eV), each light emitting device 352B of group 354B emits light having a photon energy that satisfies a second energy threshold (for example, 1.42 eV), and each light emitting device 352N of group 354N emits light having a photon energy that satisfies a third energy threshold (for example, 0.67 eV). In some cases, the first, second, and third energy thresholds are based at least in part on the semiconductor materials of a multi-junction photovoltaic cell 212. For example, assuming a multi junction photovoltaic cell 212 includes three layers of semiconductor materials, the first energy threshold can correspond to an energy that the first semiconductor material absorbs, the second energy threshold can correspond to an energy that the second semiconductor material absorbs and the first semiconductor material allows to pass therethrough, and the third energy threshold can correspond to an energy that the third semiconductor material absorbs and the first and second semiconductor materials allow to pass therethrough. In an example implementation using a triple junction GaInP/GaAs/Ge photovoltaic cell, each light emitting device 352A of group 354A emits light having a photon energy of about 1.82 eV, each light emitting device 352B of group 354B emits light having a photon energy of about 1.42 eV, and each light emitting device 352N of group 354N emits light having a photon energy of about 0.67 eV.

As another non-limiting example, consider a scenario in which each light emitting device 352A of group 354A is of a first type, each light emitting device 352B of group 354B is of a second type, and each light emitting device 352N of group 354N is of a third type. In some such cases, the first type, second type, and third type can be different. In some cases, at least two of the first type, second type, and third type may be the same.

The light emission system 320 can include a controller 322. The controller 322 can include one or more processors and can be configured to control, manage, or operate one or more components of the light emission system 320. In some cases, the controller 322 can control, manage, or operate one or more components of the light emission system 320 based on one or more stored computer executable instructions. For example, the light emission system 320 can include memory that stores computer executable instructions that, when executed by the controller 322, cause the controller 322 to control, manage, or operate one or more components of the light emission system 320.

As an example, the controller 322 may be communicatively coupled to the light emitting devices 352. For instance, the controller 322 can be configured to activate a collection of the light emitting devices 352. In some cases, activation of the collection of light emitting devices 352 illuminates a remotely located multi junction photovoltaic cell 212 of a space apparatus. In some cases, the activation of the collection of the light emitting devices 352 occurs concurrently or approximately at the same time. In this way, the activation of the collection of light emitting devices 352 can concurrently make conductive each of the semiconductor layers of the multi junction photovoltaic cell 212, thereby allowing the multi-junction photovoltaic cell 212 to produce electricity. The collection of the light emitting devices 352 can include one or more light emitting devices 352. In some cases, the collection of the light emitting devices 352 includes at least one light emitting device 352 from two or more groups 354. In some cases, the collection of the light emitting devices 352 includes at least one light emitting device 352 from each group 354. In some cases, the collection of the light emitting devices 352 includes each of the light emitting devices 352 of the light emission system 352. In some cases, the collection of light emitting devices 352 includes multiple light emitting devices 352 from a particular group 354.

In some cases, the collection of the light emitting devices 352 includes fewer light emitting devices 352 than the total number of light emitting devices 352 of the light emission system 320. For example, the controller 322 can be configured to select the collection of light emitting devices 352 from the available light emitting devices 352 of the light emission system 320. As a non-limiting example, the controller 322 can be configured to select the collection of light emitting devices 352 based at least in part on the semiconductor materials of the multi junction photovoltaic cell 212. For instance, the controller 322 can be configured to select the collection of light emitting devices 352 to emit light to produce electron-hole pairs in each layer of a multi junction photovoltaic cell 212 to cause the multi junction photovoltaic cell 212 to produce electric power. As another example, the controller 322 can be configured to select the collection of light emitting devices 352 to yield substantially the same photon flux, rate of electron-hole production, current, etc. in each layer of the multi junction photovoltaic cell 212.

In some cases, a first group of light emitting devices can be configured to emit light of a first wavelength, and a second group of light emitting devices can be configured to emit light of a second wavelength. In some such cases, the collective irradiance of the first group can cause a first layer of the multi junction photovoltaic cell 212 to produce electron-hole pairs at a first rate, to produce a first current, to yield a first photon flux, etc. Furthermore, the collective irradiance of the second group can cause a second layer of the multi junction photovoltaic cell 212 to produce electron-hole pairs at a second rate, produce a second current, yield a second photon flux, etc. In some cases, the controller 322 can dynamically control the first and second groups such that the first rate is substantially equal to the second rate, the first current is substantially equal to the second current, and/or the first photon flux is substantially equal to the second photon flux. In this way, approximately the same current flows in each layer, thereby making efficient use of the multi junction photovoltaic cell 212.

The controller 322 can dynamically control the first group and second groups of light emitting devices using any of various techniques. For example, in some cases, the controller 322 controls the collective irradiance by adjusting the drive current provided to the respective light emitting devices. For example, by providing a higher drive current to the first group, the controller 322 can increase the collective irradiance of the first group. As corollary, by providing a lower drive current to the first group, the controller 322 can decrease the collective irradiance of the first group. The controller 322 can control the second group in a similar way. Thus, by adjusting the drive currents supplied to the first and second groups, the controller 322 can tune the irradiance such that it causes the same (or a substantially similar) current to flow in each of the first and second layers. Similar techniques can be used to dynamically control more than two groups of light emitting devices such that the same (or a substantially similar) current flows in each of the layers.

As another example, in some cases, the controller 322 controls the collective irradiance of the first group and second groups of light emitting devices by activating fewer or additional light emitting devices of the first group. For instance, consider a scenario in which the first group of light emitting devices includes ten light emitting devices. By activating relatively more (for example, eight) light emitting devices of the first group, the controller 322 can increase the collective irradiance of the first group. As corollary, by activating relatively fewer (for example, three) light emitting devices of the first group, the controller 322 can decrease the collective irradiance of the first group. The controller 322 can control the second group in a similar way. Thus, by adjusting the number of activated light emitting of the first and second groups, the controller 322 can tune the irradiance such that it causes the same (or a substantially similar) current to flow in each of the first and second layers. Photon recycling is the physical process that occurs in semiconductors when photons emitted via radiative recombination are reabsorbed by the semiconductor itself, possibly in a repeated process. In some instances, the controller 322 can tune the irradiance based at least in part on expected or measured piton recycling. Similar techniques can be used to dynamically control more than two groups of light emitting devices such that the same (or a substantially similar) current flows in each of the layers.

As another example, in some cases, the controller 322 controls the collective irradiance of the first group and second groups of light emitting devices based at least in part on astronomical observations, orbital predictions, or time-varying phenomena. As described herein, in some cases, the photovoltaic cell 212 and/or light emission system 320 may be located on a space apparatus, and thus communications between the light emission system 320 and the photovoltaic cell 212 can be affected by distance of the transmission through the atmosphere, humidity, smoke, clouds, an orbit of the space apparatus, etc. In some such cases, the controller 322 can select intensities of one or more light sources to provide efficient (for example, optimum or near optimum) power conversion at the photovoltaic cell 212 when light at the various wavelengths is scattered or absorbed by the atmosphere. In some cases, given the photovoltaic cell 212 with a fixed design and known location or orbit in space, the controller 322 can control the light sources to optimally convert electrical power from light emission system 320 (e.g., on Earth) into electrical power at the photovoltaic cell 212 (e.g., in space). By taking into account expected or projected scattering and/or absorption by the atmosphere, the controller 322 controls the collective irradiance of the first group and second groups of light emitting devices to ensure that a desired irradiance is received by the photovoltaic cell 212. For example, the controller 322 can ensure that the currents produced by each layer are substantially similar.

The controller 322 can be configured to cause the collection of light emitting devices 352 to operate in parallel to produce a single beam of light. For example, the light from each light emitting device 352 of the collection of light emitting devices is combined using a grating combiner.

In some cases, the controller 322 can monitor the light emitting devices 352 to determine whether the light emitting devices 352 are emitting light. In some cases, the controller 322 can determine that one or more light emitting devices 352 of the collection of light emitting devices 352 is not emitting light (for example, burnt out, not working, etc.). In some such cases, the controller 322 can be configured to disable or deactivate those light emitting devices 352 that are not working. In addition or alternatively, in response to determining that one or light emitting devices 352 are not working, the controller 322 can be configured to disable or deactivate all of the light emitting devices 352. In this way, the controller 322 advantageously limits the likelihood that the multi junction photovoltaic cell 212 malfunctions or wastes energy (for example, by overheating) as a result of the lack of light failing to activate one or more of the layers of the multi junction photovoltaic cell 212. In some cases, the controller 322 can replace an inoperable light emitting device 352 with an operable light emitting device 352 that has the same characteristic as the inoperable light emitting device 352. For example, based on a determination that one or more of the light emitting devices 352 of a particular group 354 is not emitting light (for example, burnt out, not working, etc.), the controller 322 can add one or more additional light emitting devices 352 to the collection of light emitting devices 352 (for example, turn on additional light emitting devices of that group). In this way, the controller 322 can advantageously compensate for a loss of light by activating additional light emitting devices 352 from that same group 354. In some cases, the controller 322 advantageously activates a particular number of light emitting devices 352 from each group 354 such that all the layers of the multi junction photovoltaic cell 212 are substantially equally conductive or output the same or a similar current.

In some cases, the controller 322 can be configured to determine when or if the space apparatus or the multi junction photovoltaic cell 212 does not receive a threshold amount of light, for example in the form of sunlight. Based at least in part on a determination that the light received by the space apparatus or the multi junction photovoltaic cell 212 does not satisfy a threshold, the controller 322 can be configured to cause activation of the collection of the light emitting devices 352. In some cases, the controller 322 can determine whether the light received by the space apparatus or the multi junction photovoltaic cell 212 satisfies the threshold based at least in part on astronomical observations. For example, the controller 322 can determine that the light received by the space apparatus or the multi junction photovoltaic cell 212 does not satisfy the threshold based at least in part on a determination that the space apparatus or the multi junction photovoltaic cell 212 is in eclipse.

The location of the light emission system 320 can vary across embodiments. In some instances, the light emission system 320 is located on Earth. For example, in some cases, the light emission system 320 is installed on a mountain, which gives lower atmospheric attenuation along the line of sight to the space apparatus. As another example, in some cases, the light emission system 320 is installed within an astronomical facility. The astronomical facility can be configured to transmit the beam of at least one laser to a space apparatus during times when the space apparatus is in eclipse, and to perform astronomical observations at other times, thus dividing the cost of the astronomical facility among multiple uses. As another example, in some cases, the light emission system 320 is located on a mobile vehicle, such as a ship or an airplane, which allows the operator to choose a location with no clouds along the line of sight to the space apparatus. In some instances, the light emission system 320 is located in space, such as on a space apparatus.

Converting Laser Light Into Electrical Energy Using a Multi-Junction Photovoltaic Cell Multi junction photovoltaic cells perform well in sunlight. However, the availability of sunlight may vary across embodiments. For example, sunlight may be limited or unavailable at certain periods, such as during an eclipse or when the multi junction photovoltaic cell 212 resides in a shadowed region, such as a region near a lunar pole or within a crater.

To address these or other challenges associated with providing power to the space apparatus 110 in the absence of, or without regard to, available sunlight, a light emission system 320 in accordance with the present disclosure wirelessly transfers power to the multi-junction photovoltaic cell 212. In particular, the light emission system 320 activates one or more of a plurality of light sources to illuminate the multi junction photovoltaic cell 212 to satisfy illumination conditions in each of the semiconductor materials of the multi junction structure, thereby allowing the multi junction photovoltaic cell 112 to generate power.

Figure 4:
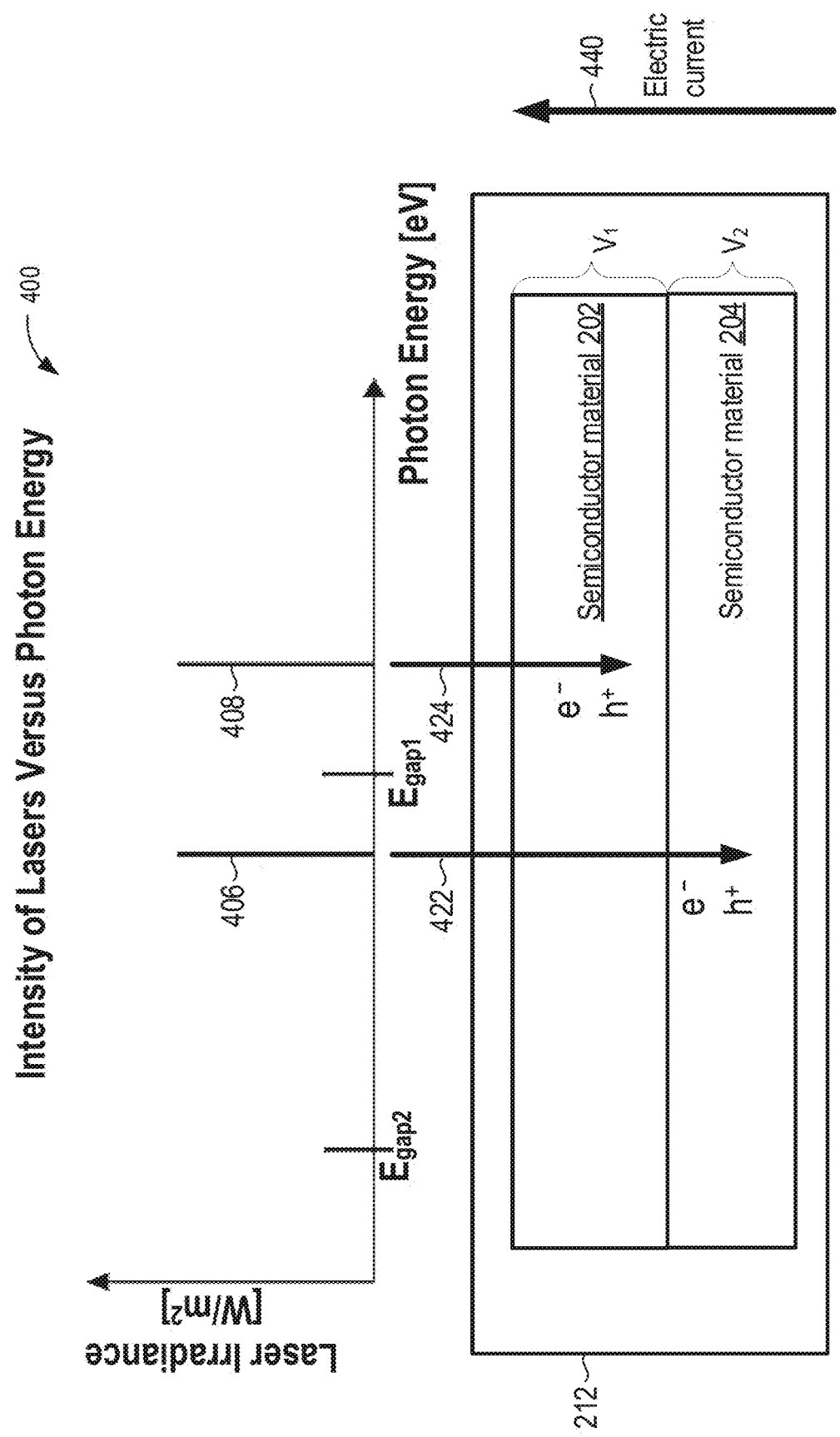
FIG. 4 includes a graph illustrating an intensity of two example laser beams plotted against photon energy.

FIG. 4 includes a graph 400 illustrating an intensity of two laser beams 406, 408 plotted against photon energy. The vertical axis on the graph 400 corresponds to light intensity in W/m². The horizontal axis on the graph 400 corresponds to photon energy, in eV. In this example, as shown by the graph 400, the laser beam 408 has a higher photon energy (and thus shorter wavelength) than the laser beam 406. Furthermore, the laser beams 406, 408 have a substantially similar intensity. The laser beams 406, 408 may be emitted by a light emission system, such as the light emission system 120 or 320 of FIG. 1 or 3, respectively.

FIG. 4 also illustrates a visual representation of interactions between example photons of the laser beams 406, 408 (represented by arrows 422 and 424) and the photovoltaic cell 212 of FIG. 2. For ease of reference, the photons are referred to as photons 422 and 424. In this example, the energy of a particular photon corresponds to the position of its representative arrow along the x-axis of graph 400. Thus, the photons 422, 424 increase in energy as they move from left to right along the x-axis of graph 400. Furthermore, given the inverse relationship between the energy of a photon and the wavelength of the photon, the photons 422, 424 decrease in wavelength, respectively. As described herein, the photovoltaic cell 212 can be part of a space apparatus 110. In some cases, the photovoltaic cell 212 receives the light from the light emission system 120, 320 while the space apparatus 110 is deployed in space and is operational.

Continuing with the example of FIG. 2, the photovoltaic cell 212 is a two-junction photovoltaic cell that includes two layers of semiconductor materials 202, 204, each layer being associated with a different bandgap energy. In particular, semiconductor material 202 is associated with a bandgap energy of $E_{gap1}$, and semiconductor material 404 is associated with a bandgap energy of $E_{gap2}$. Furthermore, the semiconductor materials 402, 404 are layered in descending order (for example, in decreasing proximity to the light emission system) based on their associated bandgap energies.

In the illustrative example of FIG. 4, the photon 424 has a photon energy greater than $E_{gap1}$. Accordingly, the photon 424 enters and is absorbed by the semiconductor material 202, since its photon energy is greater than the bandgap energy ($E_{gap1}$) associated with the semiconductor material 202. As described herein, absorbing the proton 424 yields electrical energy in the form of a junction voltage $V_1$ and an associated first current.

Continuing with the example of FIG. 4, the photon 422 has a photon energy greater than $E_{gap2}$, but less than $E_{gap1}$. Accordingly, the photon 422 enters and passes through the semiconductor material 202, since its photon energy does not satisfy the band gap energy ($E_{gap1}$) of the semiconductor material 202. In addition, the photon 422 enters and is absorbed by the semiconductor material 204, since its photon energy is greater than the band gap energy ($E_{gap2}$) associated with the semiconductor material 204. As described herein, absorbing the proton 422 yields electrical energy in the form of a junction voltage $V_2$ and an associated second current.

In general, in a series-connected multi junction photovoltaic cell, the total voltage of a multi junction photovoltaic cell is approximately equal to the sum of the junction voltages (for example, $V_1$, $V_2$) of all the semiconductor materials under respective illumination conditions in the multi junction structure. In contrast, the total current 440 of the multi junction photovoltaic cell is typically limited to the smallest current produced by any of the semiconductor junctions. In general, the particular semiconductor material that limits the current 440 (i.e., the semiconductor material that produces the least amount of current) is referred to as the limiting material. Thus, in the above example, the current 440 generated in the photovoltaic cell 212 will be the lesser of the first current generated by the semiconductor material 202 and the second current generated by the semiconductor material 204. As described herein, one or more conditions can be adjusted to reduce the limitations associated with the limiting material and/or more closely match currents of the semiconductor materials 202, 204. For example, in some cases, the semiconductor materials 202, 204 are characterized by a plurality of thicknesses and lateral dimensions. In some such cases, a particular thickness or lateral dimension of the limiting material or another material may be adjusted. As another example, the type of semiconductor material 202, 204 may be adjusted. As another example, the incident total and spectral irradiance applied to the limiting material may be modified to modify the current output.

Nonlimiting Example

Figure 5:
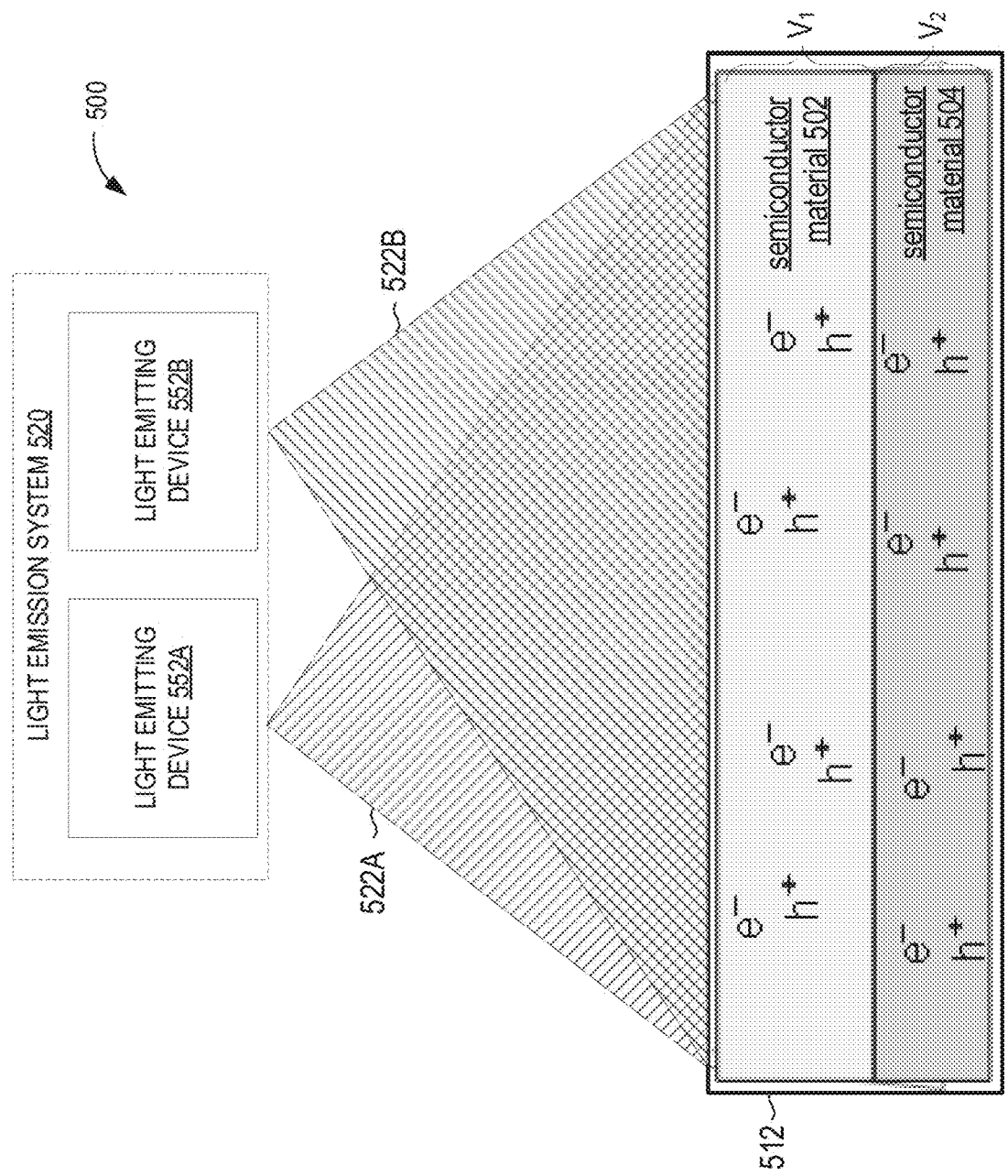
FIG. 5 illustrates an environment for wirelessly transmitting power to a two-junction photovoltaic cell via a light emission system, in accordance with the present disclosure.

FIG. 5 illustrates an environment 500 for wirelessly transmitting power to a two-junction photovoltaic cell 512 via a light emission system 520. The environment 500 includes the light emission system 520, which may be an example of the light emission systems 120 or 320 of FIG. 1 or 2, respectively, and the two-junction photovoltaic cell 512, which may be an example of the photovoltaic cell 112 or 212 of FIG. 1 or 2, respectively.

The light emission system 520 includes a first light emitting device 552A and a second light emitting device 552B. In some cases, the light emitting devices 552A, 552B are implemented as lasers. For example, either of the light emitting devices 552A, 552B can be implemented as one or more of the following laser types: GaAs (940 nm, 1.32 eV), krypton (753 nm, 1.65 eV), strained quantum-well AlInGaP (668 nm, 1.86 eV), krypton-argon (green) laser, a helium-neon (red) laser, a helium-neon laser, a gallium arsenide laser, among others. In this example, both light emitting devices 552A, 552B produce light beams 522A, 522B with photon energy corresponding to their laser type. As described herein, the light beams 522A, 522B can have one or more similar characteristics, such as a similar wavelength, photon energy, photon flux, or laser type. In addition or alternatively, the light beams 522A, 522B can have different characteristics, such as a different wavelength, photon energy, photon flux, or laser type. In some cases, each light emitting device 552A, 552B is instantiated in a single laser, with beams from each aimed at the two-junction photovoltaic cell. Furthermore, in this example, the light emitting devices 552A, 552B are a particular distance away from the two-junction photovoltaic cell 512 such that each beam 522A, 522B covers the two-junction photovoltaic cell. Although the light emitting devices 552A, 552B are illustrated as being the same or a similar distance away from the photovoltaic cell 512, it will be understood that the distance between light emitting devices 552A, 552B may vary. For example, in some cases, the light emitting device 552A may be part of a first light emission system and the light emitting device 552B may be part of a second, different light emission system.

In this example, the light beam 522A from the light emitting device 552A produces electron-hole pairs in "Layer 1" 502 of the two-junction photovoltaic cell 512, and the light beam 522B from the light emitting device 552B produces electron-hole pairs in "Layer 2" 504 of the two-junction photovoltaic cell 512. As a result, the two-junction photovoltaic cell 512 produces electric power in response to illumination by the light emission system 520.

In the illustrative example of FIG. 5, the light beam 522A has a photon energy greater than the bandgap energy of the semiconductor material 502. Accordingly, the light beam 522A enters and its photons are absorbed by the semiconductor material 502, since its photon energy is greater than the bandgap energy associated with the semiconductor material 502. As described herein, absorbing protons yields electrical energy in the form of a junction voltage $V_1$ and an associated first current.

Continuing with the example of FIG. 5, the light beam 522B has a photon energy greater than the bandgap energy of the semiconductor material 504, but less than the bandgap energy of the semiconductor material 502. Accordingly, the light beam 522B enters and passes through the semiconductor material 502, since its photon energy does not satisfy the bandgap energy of the semiconductor material 502. In addition, the light beam 522B enters and its photons are absorbed by the semiconductor material 504, since the photon energy is greater than the bandgap energy associated with the semiconductor material 504. As described herein, absorbing the protons yields electrical energy in the form of a junction voltage $V_2$ and an associated second current.

In the above example, the current generated in the photovoltaic cell 212 will be the lesser of the first current generated by the semiconductor material 502 and the second current generated by the semiconductor material 504. In some cases, the intensity of the light beams 522A and 522B are adjusted such that the first current generated by the semiconductor material 502 and the second current generated by the semiconductor material 504 is approximately equal.

Example Embodiments

Various example embodiments of systems, methods, and non-transitory computer-readable medium relating to wirelessly transferring power to a multi junction photovoltaic cell of a space apparatus can be found in the following clauses:

Clause 1. A system for wirelessly transferring power to a multi junction photovoltaic cell of a space apparatus, the system comprising:
    a plurality of groups of light emitting devices, wherein the plurality of groups comprises at least a first group of light emitting devices and a second group of light emitting devices, wherein each light emitting device of the first group is configured to emit light within a first range of wavelengths, and wherein each light emitting device of the second group is configured to emit light within a second range of wavelengths that is nonoverlapping with the first range of wavelengths; and
    a controller configured to cause concurrent activation of a collection of light emitting devices to illuminate a remotely located multi junction photovoltaic cell of a space apparatus, wherein the collection of light emitting devices comprises at least one light emitting device from each of the plurality of groups of light emitting devices,
    wherein the multi junction photovoltaic cell converts sunlight into electrical energy, wherein the multi junction photovoltaic cell converts illumination from the collection of light emitting devices into electrical energy in the absence of the sunlight, wherein the multi junction photovoltaic cell comprises a plurality of layers of different semiconductor material, and wherein a first layer of the plurality of layers of different semiconductor material absorbs light having a wavelength within the first range of wavelengths and allows light having a wavelength within the second range of wavelengths to pass therethrough, wherein a second layer of the plurality of layers of different semiconductor material is distal from the plurality of groups of light emitting devices relative to the first layer and absorbs light having the wavelength within the second range of wavelengths, and wherein illuminating the multi junction photovoltaic cell using the collection of light emitting devices produces electron-hole pairs in each layer of the multi junction photovoltaic cell and causes the multi junction photovoltaic cell to produce electric power.

Clause 2. A system for wirelessly transferring power to a multi junction photovoltaic cell of a space apparatus, the system comprising one or more processors configured to:

select a first set of light emitting devices from a first group of light emitting devices based at least in part on a first photon flux associated with the first set of light emitting devices, wherein each light emitting device of the first group is configured to emit light within a first range of wavelengths;

select a second set of light emitting devices from a second group of light emitting devices based at least in part on a second photon flux associated with the second set of light emitting devices, wherein each light emitting device of the second group is configured to emit light within a second range of wavelengths that is nonoverlapping with the first range of wavelengths, wherein the selection of the first set of light emitting devices and the second set of light emitting devices results in the first photon flux being substantially equal to the second photon flux; and concurrently activate first set of light emitting devices and the second set of light emitting devices to cause illumination of a remotely located multi junction photovoltaic cell of a space apparatus, wherein the multi junction photovoltaic cell comprises a plurality of layers of different semiconductor material, wherein a first layer of the plurality of layers absorbs light having a wavelength within the first range of wavelengths and allows light having a wavelength within the second range of wavelengths to pass therethrough, wherein the first layer produces a first current based at least in part on the first photon flux, wherein a second layer of the plurality of layers absorbs light having the wavelength within the second range of wavelengths, wherein the second layer produces a second current based at least in part on the second photon flux, and wherein the multi junction photovoltaic cell converts sunlight into electrical energy, wherein the multi junction photovoltaic cell converts illumination from the collection of light emitting devices into electrical energy in the absence of the sunlight, wherein the illumination the multi junction photovoltaic cell produces electron-hole pairs in each layer of the plurality of layers, thereby causing the multi junction photovoltaic cell to produce electric power.

Clause 3. A system for wirelessly transferring power to a multi junction photovoltaic cell of a space apparatus, the system comprising:

a plurality of groups of light emitting devices, wherein the plurality of groups comprises at least a first group of light emitting devices and a second group of light emitting devices, wherein each light emitting device of the first group is configured to emit light within a first range of wavelengths, and wherein each light emitting device of the second group is configured to emit light within a second range of wavelengths that is nonoverlapping with the first range of wavelengths; and a controller configured to control a collection of light emitting devices to concurrently illuminate a remotely located multi junction photovoltaic cell of a space apparatus, wherein the collection of light emitting devices comprises at least one light emitting device from each of the plurality of groups of light emitting devices, wherein to control the collection of light emitting devices, the controller is configured to:

selectively activate a first set of light emitting devices from the first group of light emitting devices to collectively yield a first photon flux, and selectively activate a second set of light emitting devices from the second group of light emitting devices to collectively yield a second photon flux, wherein the first photon flux is substantially equal to the second photon flux, wherein the multi junction photovoltaic cell converts sunlight into electrical energy, wherein the multi junction photovoltaic cell converts illumination from the collection of light emitting devices into electrical energy in the absence of the sunlight, wherein the multi junction photovoltaic cell comprises a plurality of layers of different semiconductor material, wherein a first layer of the plurality of layers of different semiconductor material absorbs light having a wavelength within the first range of wavelengths and allows light having a wavelength within the second range of wavelengths to pass therethrough, wherein the first layer produces a first current based at least in part on the first photon flux, wherein a second layer of the plurality of layers of different semiconductor material is distal from the plurality of groups of light emitting devices relative to the first layer and absorbs light having the wavelength within the second range of wavelengths, wherein the second layer produces a second current based at least in part on the second photon flux, and wherein illuminating the multi junction photovoltaic cell using the collection of light emitting devices produces electron-hole pairs in each layer of the multi junction photovoltaic cell and causes the multi junction photovoltaic cell to produce electric power.

Clause 4. The system of any of the previous clauses, wherein to select the first set of light emitting devices, the controller is configured to select a first drive current for at least one light emitting device of the first set of light emitting devices, wherein the first photon flux is based at least in part on the first drive current.

Clause 5. The system of any of the previous clauses, wherein to select the first set of light emitting devices, the controller is configured to select a first number of light emitting devices from the first set of light emitting devices, wherein the first photon flux is based at least in part on the first number of light emitting devices, and wherein to select the first set of light emitting devices, the controller is configured to select a second number of light emitting devices from the second set of light emitting devices, wherein the second photon flux is based at least in part on the second number of light emitting devices, wherein the second number of light emitting devices is different from the first number of light emitting devices.

Clause 6. The system of any of the previous clauses, wherein the illumination of the remotely located multi junction photovoltaic cell causes the first current produced by the first layer to be substantially equal to the second current produced by the second layer.

Clause 7. The system of any of the previous clauses, wherein to select the first set of light emitting devices, the controller is configured to select the first set of light emitting devices based at least in part on at least one of a semiconductor material of the first layer or a semiconductor material of the second layer.

Clause 8. The system of any of the previous clauses, wherein the plurality of groups further comprises at least a third group of light emitting devices, wherein each light emitting device of the third group is configured to emit light within a third range of wavelengths that is nonoverlapping with the first range of wavelengths and the second range of wavelengths, wherein the first layer and the second layer allow light having a wavelength within the third range of wavelengths to pass therethrough, wherein a third layer of the plurality of layers of different semiconductor material absorbs light having the wavelength within the third range of wavelengths.

Clause 9. The system of any of the previous clauses, wherein an order of the plurality of layers is a descending order of a band gap energy associated with each layer, wherein the first layer is associated with a higher bandgap energy than the second layer, wherein the second layer is associated with a higher bandgap energy than the third layer, and wherein the first layer is closer to the plurality of groups of light emitting devices than the second layer.

Clause 10. The system of any of the previous clauses, wherein each group of the plurality of groups corresponds to a different type of light emitting device.

Clause 11. The system of any of the previous clauses, wherein each light emitting device of a particular group of the plurality of groups corresponds to a same type of light emitting device.

Clause 12. The system of any of the previous clauses, wherein each light emitting device of a particular group of the plurality of groups emits light of a same wavelength.

Clause 13. The system of any of the previous clauses, wherein at least one group of the plurality of groups includes a plurality of light emitting devices.

Clause 14. The system of any of the previous clauses, wherein each group of the plurality of groups includes only one light emitting device.

Clause 15. The system of any of the previous clauses, wherein each group of the plurality of groups includes a plurality of light emitting devices.

Clause 16. The system of any of the previous clauses, wherein at least one light emitting device of the plurality of groups of light emitting devices is a laser.

Clause 17. The system of any of the previous clauses, wherein each light emitting device of the plurality of groups of light emitting devices is a laser.

Clause 18. The system of any of the previous clauses, wherein the collection of light emitting devices comprises fewer light emitting devices than the plurality of groups of light emitting devices.

Clause 19. The system of any of the previous clauses, wherein the controller is further configured to identify the collection of light emitting devices from the plurality of groups of light emitting devices, wherein to identify the collection of light emitting devices, the controller is configured to select at least one light emitting device from each of the plurality of groups of light emitting devices.

Clause 20. The system of any of the previous clauses, wherein the controller selects the at least one light emitting device from each of the plurality of groups of light emitting devices based at least in part on the semiconductor materials of the plurality of layers.

Clause 21. The system of any of the previous clauses, wherein a flow of electricity is induced only when each layer of different semiconductor material concurrently absorbs light.

Clause 22. The system of any of the previous clauses, wherein the first group of light emitting devices is mutually exclusive with the second group of light emitting devices.

Clause 23. The system of any of the previous clauses, wherein the first group of light emitting devices at least partially overlaps with the second group of light emitting devices.

Clause 24. The system of any of the previous clauses, further comprising a frequency doubler, wherein the first group of light emitting devices comprises a first laser, wherein the second group of light emitting devices comprises the first laser and the frequency doubler.

Clause 25. The system of any of the previous clauses, wherein the collection of light emitting devices comprises a plurality of light emitting devices from the first group of light emitting devices, and wherein the controller is configured to operate the plurality of light emitting devices in parallel to produce a single beam of light.

Clause 26. The system of any of the previous clauses, wherein each light emitting device of the collection of light emitting devices shares a single aperture.

Clause 27. The system of any of the previous clauses, wherein a beam of each light emitting device of the collection of light emitting devices is combined using a grating combiner.

Clause 28. The system of any of the previous clauses, wherein each light emitting device of the collection of light emitting devices comprises a distinct aperture.

Clause 29. The system of clause 28, wherein the plurality of distinct apertures are sized to produce a same beam angle.

Clause 30. The system of any of the previous clauses, wherein at least two light emitting devices of the collection of light emitting devices yield substantially the same photon flux at the multi junction photovoltaic cell, thereby resulting in a substantially similar current from corresponding layers of the plurality of layers.

Clause 31. The system of any of the previous clauses, wherein at least two light emitting devices of the collection of light emitting devices yield substantially the same rate of electron-hole production within at least two layers of the multi junction photovoltaic cell, thereby resulting in a substantially similar current from corresponding layers of the plurality of layers.

Clause 32. The system of any of the previous clauses, wherein the controller is further configured to disable power to at least one light emitting device of the collection of light emitting devices based at least in part on a determination that the at least one light emitting device is not emitting light.

Clause 33. The system of any of the previous clauses, wherein the first group of light emitting devices comprises a first laser and a second laser, wherein the collection of light emitting devices comprises the first laser, and wherein the controller is configured to activate the second laser based at least in part on a determination that the first laser is not emitting light.

Clause 34. The system of any of the previous clauses, wherein the controller is configured to cause the concurrent activation of the collection of light emitting devices based at least in part on a determination that the space apparatus is in eclipse.

Clause 35. The system of any of the previous clauses, wherein the controller is configured to:
  perform astronomical observations; and
  cause the concurrent activation of the collection of light emitting devices based at least in part on the astronomical observations.

Clause 36. The system of any of the previous clauses, wherein prior to the concurrent activation of the collection of light emitting devices, the space apparatus is deployed in space and is operational.

Clause 37. The system of any of the previous clauses, wherein the layers of the plurality of layers of the multi junction photovoltaic cell are each characterized by a thickness and lateral dimensions.

Clause 38. The system of any of the previous clauses, wherein the plurality of layers of the multi junction photovoltaic cell is provided in a stacked multilayer geometry such that the plurality of layers is arranged one on top of the other and coextensive, wherein the first layer is proximate a top of the stacked multilayer geometry relative to the second layer.

Clause 39. The system of any of the previous clauses, wherein the multi-junction photovoltaic cell further comprises a plurality of interface surfaces positioned between each of the plurality of layers.

Clause 40. The system of any of the previous clauses, wherein the second layer only receives illumination that has first passed through and/or been re-emitted by the first layer due to photon recycling.

Clause 41. The system of any of the previous clauses, wherein the multi-junction photovoltaic cell is a series-connected multi junction photovoltaic cell such that each layer of the plurality of layers is connected electrically in series.

Clause 42. A system comprising the laser system and the multi junction photovoltaic cell of any of the previous clauses.

Clause 43. A method for wirelessly transferring power to a multi junction photovoltaic cell of a space apparatus, the method comprising:
  selecting a first set of light emitting devices from a first group of light emitting devices based at least in part on a first photon flux associated with the first set of light emitting devices, wherein each light emitting device of the first group is configured to emit light within a first range of wavelengths;
  selecting a second set of light emitting devices from a second group of light emitting devices based at least in part on a second photon flux associated with the second set of light emitting devices, wherein each light emitting device of the second group is configured to emit light within a second range of wavelengths that is nonoverlapping with the first range of wavelengths, wherein the said selecting the first set of light emitting devices and said selecting the second set of light emitting devices results in the first photon flux being substantially equal to the second photon flux; and
  concurrently activating first set of light emitting devices and the second set of light emitting devices to cause illumination of a remotely located multi junction photovoltaic cell of a space apparatus, wherein the multi junction photovoltaic cell comprises a plurality of layers of different semiconductor material, wherein a first layer of the plurality of layers absorbs light having a wavelength within the first range of wavelengths and allows light having a wavelength within the second range of wavelengths to pass therethrough, wherein the first layer produces a first current based at least in part on the first photon flux, wherein a second layer of the plurality of layers absorbs light having the wavelength within the second range of wavelengths, wherein the second layer produces a second current based at least in part on the second photon flux, and wherein the multi junction photovoltaic cell converts sunlight into electrical energy, wherein the multi junction photovoltaic cell converts illumination from the collection of light emitting devices into electrical energy in the absence of the sunlight, wherein the illumination the multi junction photovoltaic cell produces electron-hole pairs in each layer of the plurality of layers, thereby causing the multi junction photovoltaic cell to produce electric power.

Clause 44. The method of clause 43, wherein said selecting the first set of light emitting devices comprises selecting a first drive current for at least one light emitting device of the first set of light emitting devices, wherein the first photon flux is based at least in part on the first drive current.

Clause 45. The method of any of clauses 43 or 44,
  wherein said selecting the first set of light emitting devices comprises selecting a first number of light emitting devices from the first set of light emitting devices, wherein the first photon flux is based at least in part on the first number of light emitting devices,
  wherein said selecting the second set of light emitting devices comprises selecting a second number of light emitting devices from the second set of light emitting devices, wherein the second photon flux is based at least in part on the second number of light emitting devices, wherein the second number of light emitting devices is different from the first number of light emitting devices.

Clause 46. The method of any of clauses 43 to 45, wherein the illumination of the remotely located multi junction photovoltaic cell causes the first current produced by the first layer to be substantially equal to the second current produced by the second layer.

Clause 47. The method of any of clauses 43 to 46, wherein said selecting the first set of light emitting devices is based at least in part on at least one of a semiconductor material of the first layer or a semiconductor material of the second layer.

Clause 48. The method of any of clauses 43 to 47, further comprising any of the steps or features of any of the previous clauses.

Clause 49. A non-transitory computer-readable medium comprising computer executable instructions that when executed by one or more processors cause the one or more processors to perform a method comprising:
  selecting a first set of light emitting devices from a first group of light emitting devices based at least in part on a first photon flux associated with the first set of light emitting devices, wherein each light emitting device of the first group is configured to emit light within a first range of wavelengths;
  selecting a second set of light emitting devices from a second group of light emitting devices based at least in part on a second photon flux associated with the second set of light emitting devices, wherein each light emitting device of the second group is configured to emit light within a second range of wavelengths that is nonoverlapping with the first range of wavelengths, wherein the said selecting the first set of light emitting devices and said selecting the second set of light emitting devices results in the first photon flux being substantially equal to the second photon flux; and concurrently activating first set of light emitting devices and the second set of light emitting devices to cause illumination of a remotely located multi junction photovoltaic cell of a space apparatus, wherein the multi junction photovoltaic cell comprises a plurality of layers of different semiconductor material, wherein a first layer of the plurality of layers absorbs light having a wavelength within the first range of wavelengths and allows light having a wavelength within the second range of wavelengths to pass therethrough, wherein the first layer produces a first current based at least in part on the first photon flux, wherein a second layer of the plurality of layers absorbs light having the wavelength within the second range of wavelengths, wherein the second layer produces a second current based at least in part on the second photon flux, and wherein the multi junction photovoltaic cell converts sunlight into electrical energy, wherein the multi junction photovoltaic cell converts illumination from the collection of light emitting devices into electrical energy in the absence of the sunlight, wherein the illumination the multi junction photovoltaic cell produces electron-hole pairs in each layer of the plurality of layers, thereby causing the multi junction photovoltaic cell to produce electric power.

Clause 50. The non-transitory computer-readable medium of clause 49, wherein said selecting the first set of light emitting devices comprises selecting a first drive current for at least one light emitting device of the first set of light emitting devices, wherein the first photon flux is based at least in part on the first drive current.

Clause 51. The non-transitory computer-readable medium of any of clauses 49 or 50,
  wherein said selecting the first set of light emitting devices comprises selecting a first number of light emitting devices from the first set of light emitting devices, wherein the first photon flux is based at least in part on the first number of light emitting devices,
  wherein said selecting the second set of light emitting devices comprises selecting a second number of light emitting devices from the second set of light emitting devices, wherein the second photon flux is based at least in part on the second number of light emitting devices, wherein the second number of light emitting devices is different from the first number of light emitting devices.

Clause 52. The non-transitory computer-readable medium of any of clauses 49 to 51, wherein the illumination of the remotely located multi junction photovoltaic cell causes the first current produced by the first layer to be substantially equal to the second current produced by the second layer.

Clause 53. The non-transitory computer-readable medium of any of clauses 49 to 52, wherein said selecting the first set of light emitting devices is based at least in part on at least one of a semiconductor material of the first layer or a semiconductor material of the second layer.

Clause 54. The non-transitory computer-readable medium of any of clauses 49 to 53, further comprising any of the steps or features of any of the previous clauses.

Terminology

While the above detailed description has shown, described, and pointed out novel features of the present disclosure as applied to various embodiments, it will be understood that various omissions, substitutions, and changes in the form and details of the device or process illustrated may be made by those skilled in the art without departing from the spirit of the present disclosure. As will be recognized, the present disclosure may be embodied within a form that does not provide all of the features and benefits set forth herein, as some features may be used or practiced separately from others. All changes which come within the meaning and range of equivalency of the claims are to be embraced within their scope.

The term "comprising" as used herein is synonymous with "including," "containing," or "characterized by," and is inclusive or open-ended and does not exclude additional, unrecited elements or method steps. With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (for example, "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (for example, the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (for example, "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches. For example, terms such as about, approximately, substantially, and the like may represent a percentage relative deviation, in various embodiments, of ±1%, ±5%, ±10%, or ±20%.

The above description discloses several methods and materials of the present disclosure. The present disclosure is susceptible to modifications in the methods and materials, as well as alterations in the fabrication methods and equipment. Such modifications will become apparent to those skilled in the art from a consideration of this disclosure. Consequently, it is not intended that the present disclosure be limited to the specific embodiments disclosed herein, but that it covers all modifications and alternatives coming within the true scope and spirit of the present disclosure.

What is claimed is:

1. A system for wirelessly transferring power to a multi-junction photovoltaic cell of a first space apparatus, the system comprising:
   a plurality of groups of light emitting devices of a second space apparatus that is capable of operating outside an atmosphere of Earth, wherein the plurality of groups comprises at least a first group of light emitting devices and a second group of light emitting devices, wherein each light emitting device of the first group is configured to emit light within a first range of wavelengths, and wherein each light emitting device of the second group is configured to emit light within a second range of wavelengths that is nonoverlapping with the first range of wavelengths; and
   a controller configured to control a collection of light emitting devices to concurrently illuminate a remotely located multi-junction photovoltaic cell of the first space apparatus, wherein the first space apparatus is capable of operating outside the atmosphere of Earth and when an object at least partially prevents sunlight from reaching the first space apparatus, wherein the collection of light emitting devices comprises at least one light emitting device from each of the plurality of groups of light emitting devices, wherein each light emitting device of the collection of light emitting devices shares an aperture sized to produce a same beam angle, and wherein to control the collection of light emitting devices, the controller is configured to:
   selectively activate a first set of light emitting devices from the first group of light emitting devices to collectively yield a first photon flux, and
   selectively activate a second set of light emitting devices from the second group of light emitting devices to collectively yield a second photon flux, wherein the first photon flux is substantially equal to the second photon flux,
   wherein the multi-junction photovoltaic cell converts sunlight into electrical energy, wherein the multi-junction photovoltaic cell converts illumination from the collection of light emitting devices into electrical energy in the absence of the sunlight, wherein the multi-junction photovoltaic cell comprises a plurality of layers of different semiconductor material,
   wherein a first layer of the plurality of layers of different semiconductor material absorbs light having a wavelength within the first range of wavelengths and allows light having a wavelength within the second range of wavelengths to pass therethrough, wherein the first layer produces a first current based at least in part on the first photon flux,
   wherein a second layer of the plurality of layers of different semiconductor material is distal from the plurality of groups of light emitting devices relative to the first layer and absorbs light having the wavelength within the second range of wavelengths, wherein the second layer produces a second current based at least in part on the second photon flux, and
   wherein illuminating the multi-junction photovoltaic cell using the collection of light emitting devices produces electron-hole pairs in each layer of the multi-junction photovoltaic cell and causes the multi-junction photovoltaic cell to produce electric power.

2. The system of claim 1, wherein to select the first set of light emitting devices, the controller is configured to select a first drive current for at least one light emitting device of the first set of light emitting devices, wherein the first photon flux is based at least in part on the first drive current.

3. The system of claim 1,
   wherein to select the first set of light emitting devices, the controller is configured to select a first number of light emitting devices from the first set of light emitting devices, wherein the first photon flux is based at least in part on the first number of light emitting devices, and
   wherein to select the second set of light emitting devices, the controller is configured to select a second number of light emitting devices from the second set of light emitting devices, wherein the second photon flux is based at least in part on the second number of light emitting devices, wherein the second number of light emitting devices is different from the first number of light emitting devices.

4. The system of claim 1, wherein the illumination of the remotely located multi-junction photovoltaic cell causes the first current produced by the first layer to be substantially equal to the second current produced by the second layer.

5. The system of claim 1, wherein to select the first set of light emitting devices, the controller is configured to select the first set of light emitting devices based at least in part on at least one of a semiconductor material of the first layer or a semiconductor material of the second layer.

6. The system of claim 1, wherein the plurality of groups further comprises at least a third group of light emitting devices, wherein each light emitting device of the third group is configured to emit light within a third range of wavelengths that is nonoverlapping with the first range of wavelengths and the second range of wavelengths, wherein the first layer and the second layer allow light having a wavelength within the third range of wavelengths to pass therethrough, wherein a third layer of the plurality of layers of different semiconductor material absorbs light having the wavelength within the third range of wavelengths.

7. The system of claim 6, wherein an order of the plurality of layers is a descending order of a band gap energy associated with each layer, wherein the first layer is associated with a higher bandgap energy than the second layer, wherein the second layer is associated with a higher bandgap energy than the third layer, and wherein the first layer is closer to the plurality of groups of light emitting devices than the second layer.

8. The system of claim 1, wherein each group of the plurality of groups corresponds to a different type of light emitting device.

9. The system of claim 1, wherein at least one light emitting device of the plurality of groups of light emitting devices is a laser.

10. The system of claim 1, wherein the collection of light emitting devices comprises fewer light emitting devices than the plurality of groups of light emitting devices.

11. The system of claim 1, wherein the first group of light emitting devices at least partially overlaps with the second group of light emitting devices.

12. The system of claim 1, further comprising a frequency doubler, wherein the first group of light emitting devices comprises a first laser, wherein the second group of light emitting devices comprises the first laser and the frequency doubler.

13. The system of claim 1, wherein a beam of each light emitting device of the collection of light emitting devices is combined using a grating combiner.

14. The system of claim 1, wherein the controller is further configured to disable power to at least one light emitting device of the collection of light emitting devices based at least in part on a determination that the at least one light emitting device is not emitting light.

15. The system of claim 1, wherein the first group of light emitting devices comprises a first laser and a second laser, wherein the collection of light emitting devices comprises the first laser, and wherein the controller is configured to activate the second laser based at least in part on a determination that the first laser is not emitting light.

16. The system of claim 1, wherein the controller is configured to cause the concurrent activation of the collection of light emitting devices based at least in part on a determination that the first space apparatus is in eclipse.

17. The system of claim 1, wherein the controller is configured to:
perform astronomical observations; and
cause the concurrent activation of the collection of light emitting devices based at least in part on the astronomical observations.

18. The system of claim 1, wherein prior to the concurrent activation of the collection of light emitting devices, the first space apparatus is deployed in space and is operational.

19. The system of claim 1, wherein the second layer only receives illumination that has first passed through or been re-emitted by the first layer.

20. The system of claim 1, wherein the multi-junction photovoltaic cell is a series-connected multi-junction photovoltaic cell such that each layer of the plurality of layers is connected electrically in series.

21. A method for wirelessly transferring power to a multi-junction photovoltaic cell of a first space apparatus, the method comprising:
selecting a first set of light emitting devices from a first group of light emitting devices of a second space apparatus that is capable of operating outside an atmosphere of Earth based at least in part on a first photon flux associated with the first set of light emitting devices, wherein each light emitting device of the first group is configured to emit light within a first range of wavelengths wherein individual light emitting devices of the first set of light emitting devices share an aperture sized to produce a same beam angle;
selecting a second set of light emitting devices from a second group of light emitting devices of the second space apparatus based at least in part on a second photon flux associated with the second set of light emitting devices, wherein each light emitting device of the second group is configured to emit light within a second range of wavelengths that is nonoverlapping with the first range of wavelengths, wherein the said selecting the first set of light emitting devices and said selecting the second set of light emitting devices results in the first photon flux being substantially equal to the second photon flux; and
concurrently activating first set of light emitting devices and the second set of light emitting devices to cause illumination of a remotely located multi-junction photovoltaic cell of the first space apparatus, wherein the first space apparatus is capable of operating outside the atmosphere of Earth and when an object at least partially prevents sunlight from reaching the first space apparatus, wherein the multi-junction photovoltaic cell comprises a plurality of layers of different semiconductor material, wherein a first layer of the plurality of layers absorbs light having a wavelength within the first range of wavelengths and allows light having a wavelength within the second range of wavelengths to pass therethrough, wherein the first layer produces a first current based at least in part on the first photon flux, wherein a second layer of the plurality of layers absorbs light having the wavelength within the second range of wavelengths, wherein the second layer produces a second current based at least in part on the second photon flux, wherein the multi-junction photovoltaic cell converts sunlight into electrical energy, wherein the multi-junction photovoltaic cell converts illumination from a collection of light emitting devices into electrical energy in the absence of the sunlight, and wherein the multi-junction photovoltaic cell produces electron-hole pairs in each layer of the plurality of layers, thereby causing the multi-junction photovoltaic cell to produce electric power.

22. The method of claim 21, wherein said selecting the first set of light emitting devices comprises selecting a first drive current for at least one light emitting device of the first set of light emitting devices, wherein the first photon flux is based at least in part on the first drive current.

23. The method of claim 21,
wherein said selecting the first set of light emitting devices comprises selecting a first number of light emitting devices from the first set of light emitting devices, wherein the first photon flux is based at least in part on the first number of light emitting devices, and
wherein said selecting the second set of light emitting devices comprises selecting a second number of light emitting devices from the second set of light emitting devices, wherein the second photon flux is based at least in part on the second number of light emitting devices, wherein the second number of light emitting devices is different from the first number of light emitting devices.

24. The method of claim 21, wherein the illumination of the remotely located multi-junction photovoltaic cell causes the first current produced by the first layer to be substantially equal to the second current produced by the second layer.

25. The method of claim 21, wherein said selecting the first set of light emitting devices is based at least in part on at least one of a semiconductor material of the first layer or a semiconductor material of the second layer.

\* \* \* \* \*